(12) United States Patent
Takizawa et al.

(10) Patent No.: US 12,557,361 B2
(45) Date of Patent: Feb. 17, 2026

(54) SCHOTTKY BARRIER DIODE WITH HIGH WITHSTAND VOLTAGE

(71) Applicant: TAMURA CORPORATION, Tokyo (JP)

(72) Inventors: Masaru Takizawa, Tokyo (JP); Akito Kuramata, Tokyo (JP)

(73) Assignee: TAMURA CORPORATION, Tokyo (JP)

( * ) Notice: Subject to any disclaimer, the term of this patent is extended or adjusted under 35 U.S.C. 154(b) by 400 days.

(21) Appl. No.: 17/582,924

(22) Filed: Jan. 24, 2022

(65) Prior Publication Data
US 2022/0149158 A1 May 12, 2022

Related U.S. Application Data

(63) Continuation of application No. 16/801,993, filed on Feb. 26, 2020, now Pat. No. 11,264,466, which is a
(Continued)

(30) Foreign Application Priority Data

Nov. 9, 2011 (JP) ................................. 2011-245519

(51) Int. Cl.
*H10D 62/80* (2025.01)
*H01L 21/02* (2006.01)
(Continued)

(52) U.S. Cl.
CPC ....... *H10D 62/80* (2025.01); *H01L 21/02414* (2013.01); *H01L 21/02433* (2013.01);
(Continued)

(58) Field of Classification Search
CPC ............... H01L 29/24; H01L 21/02414; H01L 21/02433; H01L 21/02565;
(Continued)

(56) References Cited

U.S. PATENT DOCUMENTS 5,686,753 A 11/1997 Miyata et al.
6,177,712 B1 1/2001 Miyasaka
(Continued)

FOREIGN PATENT DOCUMENTS

CN 1744326 A 3/2006
CN 1754013 A 3/2006
(Continued)

OTHER PUBLICATIONS

T. Oshima et al. Thin Solid Films 516 (2008) 5768 (Year: 2008).*
(Continued)

*Primary Examiner* — Duy T Nguyen
*Assistant Examiner* — Zhijun Xu
(74) *Attorney, Agent, or Firm* — MCGINN INTELLECTUAL PROPERTY LAW GROUP, PLLC

(57) ABSTRACT

A Schottky barrier diode, including a first n-type semiconductor layer including a β-$Ga_2O_3$-based single crystal epitaxial layer and having a first carrier concentration that determines reverse breakdown voltage and forward voltage, a second n-type semiconductor layer including a β-$Ga_2O_3$-based single crystal substrate and having a second carrier concentration that is higher than the first carrier concentration and determines forward voltage, a Schottky electrode provided on a surface of the first n-type semiconductor layer on the opposite side to the second n-type semiconductor layer, and an ohmic electrode provided on a surface of the second n-type semiconductor layer on the opposite side to the first n-type semiconductor layer. The β-$Ga_2O_3$-based single crystal substrate includes a surface that has a plane orientation rotated by an angle of not more than 37.5° from a (010) plane.

13 Claims, 8 Drawing Sheets

Related U.S. Application Data continuation of application No. 15/436,508, filed on Feb. 17, 2017, now Pat. No. 10,600,874, which is a continuation of application No. 15/208,469, filed on Jul. 12, 2016, now Pat. No. 9,595,586, which is a continuation of application No. 14/918,129, filed on Oct. 20, 2015, now Pat. No. 9,412,882, which is a continuation of application No. 14/357,176, filed as application No. PCT/JP2012/078983 on Nov. 8, 2012, now Pat. No. 9,171,967.

(51) Int. Cl.
| | | |
|---|---|---|
| H10D 8/60 | (2025.01) | |
| H10D 62/10 | (2025.01) | |
| H10D 62/82 | (2025.01) | |
| H10D 64/64 | (2025.01) | |
| H10D 99/00 | (2025.01) | |

(52) U.S. Cl.
CPC .. *H01L 21/02565* (2013.01); *H01L 21/02576* (2013.01); *H01L 21/02631* (2013.01); *H10D 8/60* (2025.01); *H10D 62/104* (2025.01); *H10D 62/106* (2025.01); *H10D 62/82* (2025.01); *H10D 99/00* (2025.01); *H10D 64/64* (2025.01)

(58) Field of Classification Search
CPC ......... H01L 21/02576; H01L 21/02631; H01L 29/0619; H01L 29/0661; H01L 29/267; H01L 29/66969; H01L 29/872; H01L 29/47; H01L 29/045
See application file for complete search history.

(56) References Cited

U.S. PATENT DOCUMENTS

| | | | |
|---|---|---|---|
| 6,184,563 | B1 | 2/2001 | Yu |
| 7,393,411 | B2 | 7/2008 | Ichinose et al. |
| 7,531,889 | B2 | 5/2009 | Kiyama et al. |
| 7,713,353 | B2 | 5/2010 | Ichinose et al. |
| 8,262,796 | B2 | 9/2012 | Ichinose et al. |
| 8,502,310 | B2 | 8/2013 | Shiomi |
| 8,747,553 | B2 | 6/2014 | Ichinose et al. |
| 2001/0034116 | A1 | 10/2001 | Lee et al. |
| 2003/0015708 | A1 | 1/2003 | Parikh et al. |
| 2003/0062525 | A1 | 4/2003 | Parikh et al. |
| 2004/0080010 | A1 | 4/2004 | Parikh et al. |
| 2005/0242366 | A1 | 11/2005 | Parikh et al. |
| 2006/0046331 | A1 | 3/2006 | Kiyama et al. |
| 2006/0150891 | A1 | 7/2006 | Ichinose et al. |
| 2008/0083966 | A1 | 4/2008 | Oonishi |
| 2008/0142795 | A1 | 6/2008 | Ichinose et al. |
| 2008/0265264 | A1* | 10/2008 | Ichinose ........... H01L 21/02414 117/103 |
| 2010/0229789 | A1 | 9/2010 | Ichinose et al. |
| 2011/0198693 | A1 | 8/2011 | Shiomi et al. |
| 2011/0227187 | A1 | 9/2011 | Oonishi |
| 2012/0304918 | A1 | 12/2012 | Ichinose et al. |
| 2014/0217554 | A1 | 8/2014 | Sasaki |
| 2014/0239452 | A1 | 8/2014 | Sasaki |
| 2016/0233307 | A1 | 8/2016 | Sasaki |

FOREIGN PATENT DOCUMENTS

| | | | |
|---|---|---|---|
| CN | 103781947 | A | 5/2014 |
| CN | 103781948 | A | 5/2014 |
| EP | 2 754 736 | A1 | 7/2014 |
| JP | H 10-173205 | A | 6/1998 |
| JP | 2001-053293 | A | 2/2001 |
| JP | 2006-100801 | A | 4/2006 |
| JP | 2006-253521 | A | 9/2006 |
| JP | 2007-42997 | A | 2/2007 |
| JP | 2007-266475 | A | 10/2007 |
| JP | 2008-034572 | A | 2/2008 |
| JP | 2009-16875 | A | 1/2009 |
| JP | 2009200222 | A | * 9/2009 |
| JP | 2010-103353 | A | 5/2010 |
| JP | 2010-233406 | A | 10/2010 |
| JP | 2013-067524 | A | 4/2013 |
| TW | 201135954 | A1 | 10/2011 |

OTHER PUBLICATIONS

Takayoshi Oshima, "Surface morphology of homoepitaxial β-Ga2O3 thin films grown by molecular beam epitaxy", Thin Solid Films 516 5768-5771 (Year: 2008).*
Chinese Office Action, dated Aug. 2, 2022, in Chinese Application No. 201910677483.1 and English Translation thereof.
Notice of Allowance in U.S. Appl. No. 16/801,993 dated Oct. 22, 2021.
Japanese Office Action, dated Aug. 17, 2021, in Japanese Application No. 2020-038024 and English Translation thereof.
Office Action in U.S. Appl. No. 16/801,993 dated Apr. 27, 2021.
Japanese Office Action, dated Jan. 26, 2021, in Japanese Application No. 2020-038024 and English Translation thereof.
Chinese Office Action, dated Dec. 2, 2021, in Chinese Application No. 201910677483.1, with an English Translation thereof.
U.S. Notice of Allowance dated Nov. 2, 2016 in parent U.S. Appl. No. 15/208,469.
U.S. Notice of Allowance dated Apr. 11, 2016 in parent U.S. Appl. No. 14/918,129.
U.S. Non-Final Office Action dated Jan. 12, 2015 in parent U.S. Appl. No. 14/357,176.
U.S. Notice of Allowance dated Jun. 19, 2015 in parent U.S. Appl. No. 14/357,176.
Japanese Office Action dated Feb. 10, 2015 with partial English Translation.
International Search Report dated Dec. 11, 2012 in PCT/JP2012/078983 (English version).
Extended European Search Report dated Feb. 25, 2015 with an English Translation thereof.
Kipp Jay Schoen, et al., "Design Considerations and Experimental Analysis of High-Voltage SiC Schottky Barrier Rectifiers", IEEE Transactions on Electron Devices, IEEE Service Center, Piscataway, NJ, US, vol. 45, No. 7, Jul. 1, 1998.
Villora Encarnacion, et al., "Rf-plasma-assisted molecular-beam epitaxy of [beta]-Ga$_2$O$_3$", Applied Physics Letters, American Institute of Physics, US, vol. 88, No. 3, Jan. 18, 2006, pp. 31105-031105.
Japanese Office Action dated Jul. 21, 2015 with an English translation thereof.
Chinese Office Action dated Mar. 31, 2016 with an English translation thereof.
Taiwanese Office Action dated Jan. 12, 2016 with an English translation thereof.
Supplemental U.S. Notice of Allowance dated Jun. 23, 2016 in parent U.S. Appl. No. 14/918,129.
Chinese Office Action dated Nov. 11, 2016 with an English translation thereof.
Japanese Office Action dated Oct. 18, 2016 with a partial English translation.
Japanese Office Action dated Dec. 5, 2017, in Japanese Application No. 2017-133649 with an English translation thereof.
European Office Action dated Sep. 26, 2019, in European Application No. 128484600.7 with an English translation thereof.
Japanese Office Action dated Mar. 26, 2019, in Japanese Application No. 2018-127538 with an English translation thereof.
Rikiya Suzuki, et al., "Solar-Blind Photodiodes Composed Of A Au Schottky Contact And A B—Ga2 O3 Single Crystal With A High Resistivity Cap Layer", Appl. Phys, Lett, the U.S., American Institute of Physics, Mar. 31, 2011, vol. 98, 131114, https://doi.org/10.1063/1.3574911.
U.S. Non-Final Office Action dated May 6, 2019, in parent U.S. Appl. No. 15/436,508.
U.S. Final Office Action dated Sep. 4, 2019, in parent U.S. Appl. No. 15/436,508.

(56) References Cited

OTHER PUBLICATIONS

U.S. Notice of Allowance dated Nov. 13, 2019, in parent U.S. Appl. No. 15/436,508.
Chinese Office Action, dated Aug. 9, 2023, in Chinese Application No. 201910677483.1 and English Translation thereof.
Chinese Office Action, dated Jan. 28, 2023, in Chinese Application No. 201910677483.1, with an English Translation thereof.

* cited by examiner

FIG.2A

| MATERIAL | SEMICONDUCTOR LAYER | ELECTRON CARRIER CONCENTRATION ($cm^{-3}$) | RESISTIVITY ($\Omega \cdot cm$) | THICKNESS ($\mu m$) | VOLTAGE DROP (V) | TOTAL VOLTAGE DROP (V) | MAXIMUM REVERSE VOLTAGE (V) |
|---|---|---|---|---|---|---|---|
| Si | n⁻ SEMICONDUCTOR LAYER | $2.47 \times 10^{15}$ | 1.3 | 7.5 | 0.1955 | 0.2226 | 100 |
| | n⁺ SEMICONDUCTOR LAYER | $1.40 \times 10^{19}$ | 0.0045 | 300 | 0.0271 | | |
| $Ga_2O_3$ | n⁻ SEMICONDUCTOR LAYER | $8.29 \times 10^{17}$ | 0.05 | 0.402 | 0.0005 | 0.0811 | 100 |
| | n⁺ SEMICONDUCTOR LAYER | $3.47 \times 10^{18}$ | 0.0134 | 300 | 0.0806 | | |

FIG.2B

| MATERIAL | SEMICONDUCTOR LAYER | ELECTRON CARRIER CONCENTRATION ($cm^{-3}$) | RESISTIVITY ($\Omega \cdot cm$) | THICKNESS ($\mu m$) | VOLTAGE DROP (V) | TOTAL VOLTAGE DROP (V) | MAXIMUM REVERSE VOLTAGE (V) |
|---|---|---|---|---|---|---|---|
| SiC | n⁻ SEMICONDUCTOR LAYER | $2.16 \times 10^{16}$ | 0.315 | 5.46 | 0.0345 | 0.0546 | 600 |
| | n⁺ SEMICONDUCTOR LAYER | $3.47 \times 10^{18}$ | 0.01 | 100 | 0.0201 | | |
| $Ga_2O_3$ | n⁻ SEMICONDUCTOR LAYER | $1.66 \times 10^{17}$ | 0.267 | 2.0 | 0.0107 | 0.0376 | 600 |
| | n⁺ SEMICONDUCTOR LAYER | $3.47 \times 10^{18}$ | 0.0134 | 100 | 0.0269 | | |

FIG.2C

| MATERIAL | SEMICONDUCTOR LAYER | ELECTRON CARRIER CONCENTRATION ($cm^{-3}$) | RESISTIVITY ($\Omega \cdot cm$) | THICKNESS ($\mu m$) | VOLTAGE DROP (V) | TOTAL VOLTAGE DROP (V) | MAXIMUM REVERSE VOLTAGE (V) |
|---|---|---|---|---|---|---|---|
| SiC | n⁻ SEMICONDUCTOR LAYER | $1.30 \times 10^{16}$ | 0.501 | 9.1 | 0.0914 | 0.1115 | 1000 |
| | n⁺ SEMICONDUCTOR LAYER | $3.47 \times 10^{18}$ | 0.01 | 100 | 0.0201 | | |
| $Ga_2O_3$ | n⁻ SEMICONDUCTOR LAYER | $9.95 \times 10^{16}$ | 0.444 | 3.3 | 0.0296 | 0.0565 | 1000 |
| | n⁺ SEMICONDUCTOR LAYER | $3.47 \times 10^{18}$ | 0.0134 | 100 | 0.0269 | | |

FIG.2D

| MATERIAL | SEMICONDUCTOR LAYER | ELECTRON CARRIER CONCENTRATION ($cm^{-3}$) | RESISTIVITY ($\Omega \cdot cm$) | THICKNESS ($\mu m$) | VOLTAGE DROP (V) | TOTAL VOLTAGE DROP (V) | MAXIMUM REVERSE VOLTAGE (V) |
|---|---|---|---|---|---|---|---|
| SiC | n⁻ SEMICONDUCTOR LAYER | $1.30 \times 10^{15}$ | 4.45 | 90.9 | 8.1118 | 8.1319 | 10000 |
| | n⁺ SEMICONDUCTOR LAYER | $3.47 \times 10^{18}$ | 0.01 | 100 | 0.0201 | | |
| $Ga_2O_3$ | n⁻ SEMICONDUCTOR LAYER | $9.95 \times 10^{15}$ | 4.41 | 33.3 | 2.9449 | 2.9718 | 10000 |
| | n⁺ SEMICONDUCTOR LAYER | $3.47 \times 10^{18}$ | 0.0134 | 100 | 0.0269 | | |

SCHOTTKY BARRIER DIODE WITH HIGH WITHSTAND VOLTAGE

CROSS-REFERENCE TO RELATED APPLICATIONS

The present application is a Continuation Application of U.S. patent application Ser. No. 16/801,993, filed on Feb. 26, 2020, which is a Continuation Application of U.S. patent application Ser. No. 15/436,508, filed on Feb. 17, 2017, now U.S. Pat. No. 10,600,874, which is a Continuation Application of U.S. patent application Ser. No. 15/208,469, filed on Jul. 12, 2016, now U.S. Pat. No. 9,595,586, which is a Continuation Application of U.S. patent application Ser. No. 14/918,129, filed on Oct. 20, 2015, now U.S. Pat. No. 9,412,882, which is a Continuation Application of U.S. patent application Ser. No. 14/357,176, filed on May 8, 2014, now U.S. Pat. No. 9,171,967, which is based on International Patent Application No. PCT/JP2012/078983 filed on Nov. 8, 2012, which is based on Japanese Patent Application No. 2011-245519 filed on Nov. 9, 2011, the entire contents of which are hereby incorporated by reference.

TECHNICAL FIELD

The invention relates to a Schottky barrier diode in which a metal and a semiconductor are Schottky-contacted with each other.

BACKGROUND ART

A Schottky barrier diode using SiC is conventionally known as a high-voltage diode used for, e.g. an inverter circuit (see e.g. PTL 1). The Schottky barrier diode has a smaller forward voltage, a shorter reverse recovery time (trr) and better switching characteristics than a PN junction diode equivalent in current capacity. However, there is a great demand for an increase in a withstand voltage and efficiency, where it is needed to further increase the withstand voltage and to reduce the forward voltage.

CITATION LIST

Patent Literature

[PTL 1]
JP-A-2006-253521

SUMMARY OF INVENTION

Technical Problem

In the Schottky barrier diode, a forward voltage (VF) and a voltage reverse maximum (VRM, herein a reverse withstand voltage) measured when applying a reverse-bias voltage are generally in a trade-off relation. This is because it is necessary to lower a carrier concentration in order to increase the reverse withstand voltage (VRM) but the lowered carrier concentration causes an increase in electric resistance and thus an increase in the forward voltage (VF). Also, there is a problem that the lowered carrier concentration causes an increase in a contact resistance with an ohmic electrode layer and thus an increase in forward voltage (VF).

It is an object of the invention to provide a Schottky barrier diode that can control an increase in the forward voltage and an increase in the contact resistance with the ohmic electrode layer even when the reverse withstand voltage (or reverse breakdown voltage) is increased.

Solution to Problem

According to one embodiment of the invention, a Schottky barrier diode as defined in [1] to [4] below is provided so as to achieve the above object.
[1] A Schottky barrier diode, comprising:
an n-type semiconductor layer comprising a $Ga_2O_3$-based semiconductor with n-type conductivity; and
an electrode layer that is in Schottky-contact with the n-type semiconductor layer,
wherein a first semiconductor layer in Schottky-contact with the electrode layer and a second semiconductor layer having an electron carrier concentration higher than the first semiconductor layer are formed in the n-type semiconductor layer.
[2] The Schottky barrier diode according to [1], wherein a thickness of the first semiconductor layer is greater than a thickness of a depletion layer corresponding to a reverse withstand voltage.
[3] The Schottky barrier diode according to [1] or [2], wherein an electron carrier concentration in the first semiconductor layer is lower than $1 \times 10^{17}/cm^{-3}$.
[4] The Schottky barrier diode according to any one of [1] to [3], wherein the electron carrier concentration in the second semiconductor layer is higher than $1 \times 10^{18}/cm^{-3}$.

Advantageous Effects of Invention

According to one embodiment of the invention, a Schottky barrier diode that can control an increase in the forward voltage and an increase in the contact resistance with the ohmic electrode layer even when the reverse withstand voltage (or reverse breakdown voltage) is increased.

BRIEF DESCRIPTION OF DRAWINGS

FIG. 2A is a comparison table showing a relation between an electron carrier concentration, a resistivity and a thickness, and a voltage drop of an $n^-$ semiconductor layer and an $n^+$ semiconductor layer where a reverse withstand voltage is set at 100 V and Si and $Ga_2O_3$ are used as a semiconductor material.

FIG. 2B is a comparison table showing a relation between an electron carrier concentration, a resistivity and a thickness, and a voltage drop of an $n^-$ semiconductor layer and an $n^+$ semiconductor layer where a reverse withstand voltage is set at 600 V and SiC and $Ga_2O_3$ are used as a semiconductor material.

FIG. 2C is a comparison table showing a relation between an electron carrier concentration, a resistivity and a thickness, and a voltage drop of an $n^-$ semiconductor layer and an $n^+$ semiconductor layer where a reverse withstand voltage is set at 1000 V and SiC and $Ga_2O_3$ are used as a semiconductor material.

FIG. 2D is a comparison table showing a relation between an electron carrier concentration, a resistivity and a thickness, and a voltage drop of an $n^-$ semiconductor layer and an n+ semiconductor layer where a reverse withstand voltage is set at 10000 V and SiC and $Ga_2O_3$ are used as a semiconductor material.

DESCRIPTION OF EMBODIMENTS

An embodiment of a Schottky barrier diode (hereinafter, referred to as "Schottky diode") of the invention will be described below in reference to the drawings.

Figure 1:
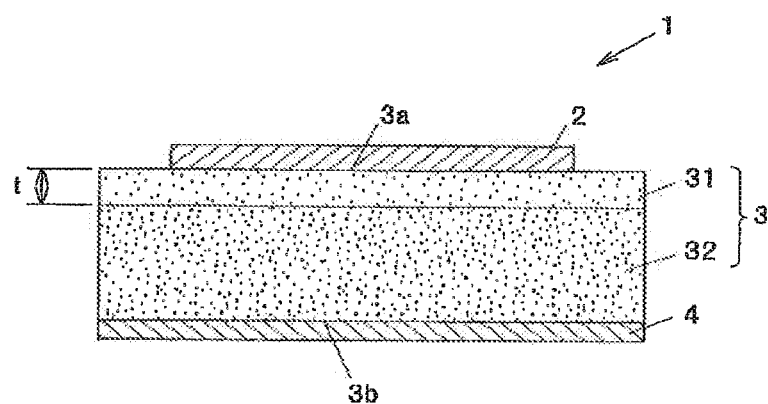
FIG. 1 is a cross sectional view showing a configuration example of a Schottky diode in an embodiment according to the invention.

FIG. 1 is a schematic view showing a cross-sectional structure of a Schottky diode 1 in the embodiment. The Schottky diode 1 is provided with an n-type semiconductor layer 3 formed of a $\beta$-$Ga_2O_3$-based compound semiconductor with n-type conductivity, a Schottky electrode layer 2 in Schottky-contact with a first main surface 3a of the n-type semiconductor layer 3, and an ohmic electrode layer 4 in ohmic-contact with a second main surface 3b of the n-type semiconductor layer 3 opposite to the main surface 3a. Alternatively, a laminated film including the Schottky electrode layer 2 as the lowermost layer may be provided on the first main surface 3a of the n-type semiconductor layer 3. Also alternatively, a laminated film including the ohmic electrode layer 4 as the lowermost layer may be provided on the second main surface 3b of the n-type semiconductor layer 3.

The n-type semiconductor layer 3 is basically formed of $\beta$-$Ga_2O_3$ but may be formed of an oxide consisting mainly of Ga to which one or more selected from the group consisting of Cu, Ag, Zn, Cd, Al, In, Si, Ge and Sn are added. In more detail, it is possible to use, e.g., gallium oxide represented by $(Al_xIn_yGa_{(1-x-y)})_2O_3$ ($0 \leq x \leq 1$, $0 \leq y < 1$, $0 \leq x+y < 1$).

In addition, the n-type semiconductor layer 3 is provided with an n− semiconductor layer 31 as a first semiconductor layer with a low electron carrier concentration and an n+ semiconductor layer 32 as a second semiconductor layer with a high electron carrier concentration. In the n-type semiconductor layer 3, the n− semiconductor layer 31 with a low electron carrier concentration is formed on a side in Schottky-contact with the Schottky electrode layer 2.

The n-type semiconductor layer 3 can be formed by, e.g., an MBE (Molecular Beam Epitaxy) method in which Ga vapor and an oxygen-based gas are supplied into a vacuum chamber and a $\beta$-$Ga_2O_3$ single crystal is epitaxially grown on a $\beta$-$Ga_2O_3$ substrate. Here, purity of Ga raw material is desirably not less than 6N in order to improve ability of controlling to low electron carrier concentration. This $\beta$-$Ga_2O_3$ substrate corresponds to the n+ semiconductor layer 32 and the epitaxial layer formed thereon corresponds to the n semiconductor layer 31.

The $\beta$-$Ga_2O_3$ substrate can be formed by, e.g., the EFG (Edge-defined film-fed growth) method. In this case, the electron carrier concentration in the $\beta$-$Ga_2O_3$ substrate (the electron carrier concentration in the n+ semiconductor layer 32) depends on oxygen defects formed during formation of the substrate or the amount of dopant such as Si. Here, the dopant is preferably Si since the amount of dopant incorporation during crystal growth is stable. Use of Si as a dopant improves controllability of the electron carrier concentration. Meanwhile, the electron carrier concentration in the n− semiconductor layer 31 can be adjusted by controlling, e.g., oxygen defects or the supplied amount of group IV dopant such as Si or Sn during epitaxial crystal growth. Furthermore, considering substitution with Ga, Sn having a similar ionic radius is preferable.

In the Schottky diode 1 of the present embodiment, an electron carrier concentration Nd in the n− semiconductor layer 31 is, e.g., $10^{16}$ $cm^{-3}$ but the electron carrier concentration Nd can be set within a range lower than $10^{18}$ $cm^{-3}$. In addition, it is preferable that the electron carrier concentration Nd be set to a lower value than $10^{17}$ $cm^{-3}$. Furthermore, the n− semiconductor layer 31 may be composed of an n layer having a relatively low electron carrier concentration and an n layer having an electron carrier concentration between that of the n− layer and that of the n+ semiconductor layer 32. The electron carrier concentration Nd in the n− semiconductor layer 31 can be set based on reverse withstand voltage VRM required for the Schottky diode 1 and electric field-breakdown strength Em of $Ga_2O_3$.

Here, the electric field-breakdown strength Em is a value inherent in $Ga_2O_3$ and the present inventors have confirmed that the electric field-breakdown strength Em of $Ga_2O_3$ is greater than electric field-breakdown strength of Si or SiC used as a material of conventional n-type semiconductor material.

In general, reverse withstand voltage of Schottky diode is proportional to the square of electric field-breakdown strength and is inversely proportional to an electron carrier concentration. Therefore, when the electric field-breakdown strength increases, the reverse withstand voltage also increases even at the same electron carrier. In addition, when the reverse withstand voltage is the same, the electron carrier concentration can be increased by increasing the electric field-breakdown strength. The increased electron carrier concentration decreases electrical resistance and thus forward voltage (VF).

FIGS. 2A to 2D are comparison tables showing a relation between an electron carrier concentration, a resistivity and a thickness, and a voltage drop upon setting a current density of 200 $A/cm^2$ of an n− semiconductor (epitaxial layer) and an n+ semiconductor layer (substrate) where Si or SiC and $Ga_2O_3$ are used as a semiconductor material. FIG. 2A is a comparison table in case of using Si and $Ga_2O_3$ at a reverse withstand voltage of 100 V, FIG. 2B is a comparison table in case of using SiC and $Ga_2O_3$ at a reverse withstand voltage of 600 V, FIG. 2C is a comparison table in case of using SiC and $Ga_2O_3$ at a reverse withstand voltage of 1000 V (1 kV), and FIG. 2D is a comparison table in case of using SiC and $Ga_2O_3$ at a reverse withstand voltage of 10000 V (10 kV).

As shown in FIG. 2A, when the reverse withstand voltage is set at 100 V, the electron carrier concentration and thickness of the n− semiconductor layer are 2.47×$10^{15}$ $cm^{-3}$ and 7.5 µm, respectively, in case of Si and 8.29×10^17 cm^−3 and 0.402 µm, respectively, in case of $Ga_2O_3$ according to the embodiment. Thereby, a voltage drop in the n⁻ semiconductor layer is 0.1955 V in case of Si and 0.0005 V in case of $Ga_2O_3$. As a result, the total voltage drop of the n⁻ semiconductor layer and the n⁺ semiconductor layer is 0.2226 V in case of Si and is 0.0811 V in case of $Ga_2O_3$, which shows that the voltage drop can be reduced by about 64%.

Also, as shown in FIG. 2B, when the reverse withstand voltage is set at 600 V, the electron carrier concentration and thickness of the n⁻ semiconductor layer are 2.16×10^16 cm^−3 and 5.46 µm, respectively, in case of SiC and 1.66×10^17 cm^−3 and 2.0 µm, respectively, in case of $Ga_2O_3$ according to the embodiment. Thereby, a voltage drop in the n⁻ semiconductor layer is 0.0345 V in case of SiC and 0.0107 V in case of $Ga_2O_3$. As a result, the total voltage drop of the n⁻ semiconductor layer and the n⁺ semiconductor layer is 0.0546 V in case of SiC and 0.0376 V in case of $Ga_2O_3$, which shows that the voltage drop can be reduced by about 31%.

Also, as shown in FIG. 2C, when the reverse withstand voltage is set at 1000 V, the electron carrier concentration and thickness of the n⁻ semiconductor layer are 1.30×10^16 cm^−3 and 9.1 µm, respectively, in case of SiC and 9.95×10^16 cm^−3 and 3.3 µm, respectively, in case of $Ga_2O_3$ according to the embodiment. Thereby, a voltage drop in the n⁻ semiconductor layer is 0.0914 V in case of SiC and 0.0296 V in case of $Ga_2O_3$. As a result, the total voltage drop of the n⁻ semiconductor layer and the n⁺ semiconductor layer is 0.1115 V in case of SiC and 0.0565 V in case of $Ga_2O_3$, which shows that the voltage drop can be reduced by about 49%.

Also, as shown in FIG. 2D, when the reverse withstand voltage is set at 10000 V, the electron carrier concentration and thickness of the n⁻ semiconductor layer are 1.30×10^15 cm^−3 and 90.9 µm, respectively, in case of SiC and 9.95×10^15 cm^−3 and 33.3 µm in case of $Ga_2O_3$ according to the embodiment. Thereby, a voltage drop in the n⁻ semiconductor layer is 8.1118 V in case of SiC and 2.9449 V in case of $Ga_2O_3$. As a result, the total voltage drop of the n⁻ semiconductor layer and the n⁺ semiconductor layer is 8.1319 V in case of SiC and 2.9718 V in case of $Ga_2O_3$, which shows that the voltage drop can be reduced by about 63%.

The Schottky electrode layer 2 shown in FIG. 1 is formed on the first main surface 3a of the n-type semiconductor layer 3 (the n⁻ semiconductor layer 31) by, e.g., the EB (Electron Beam) deposition method, a vacuum deposition method or a sputtering method. A metal which can be in Schottky-contact with $Ga_2O_3$ constituting the n⁻ semiconductor layer 31 is selected as a material of the Schottky electrode layer 2. In the present embodiment, a film of Pt is formed as the Schottky electrode layer 2 on the n-type semiconductor layer 3.

In general, in order to enable Schottky-contact providing rectifying action between a semiconductor and a metal, electron affinity χ of semiconductor and work function $\phi_m$ of metal to be an electrode need to satisfy a relation of $\chi<\phi_m$. Metals satisfying this relation are V, Mo, Ni and Pd etc. in addition to Pt used in the embodiment.

The ohmic electrode layer 4 is formed on the second main surface 3b of the n-type semiconductor layer 3 (the n⁺ semiconductor layer 32) by the vacuum deposition method or the sputtering method. A material of the ohmic electrode layer 4 is e.g. Ti. Another element may be used as a material of the ohmic electrode layer 4 as long as it is a metal of which work function $\phi_m$ is smaller than electron affinity χ of $Ga_2O_3$.

Figure 3:
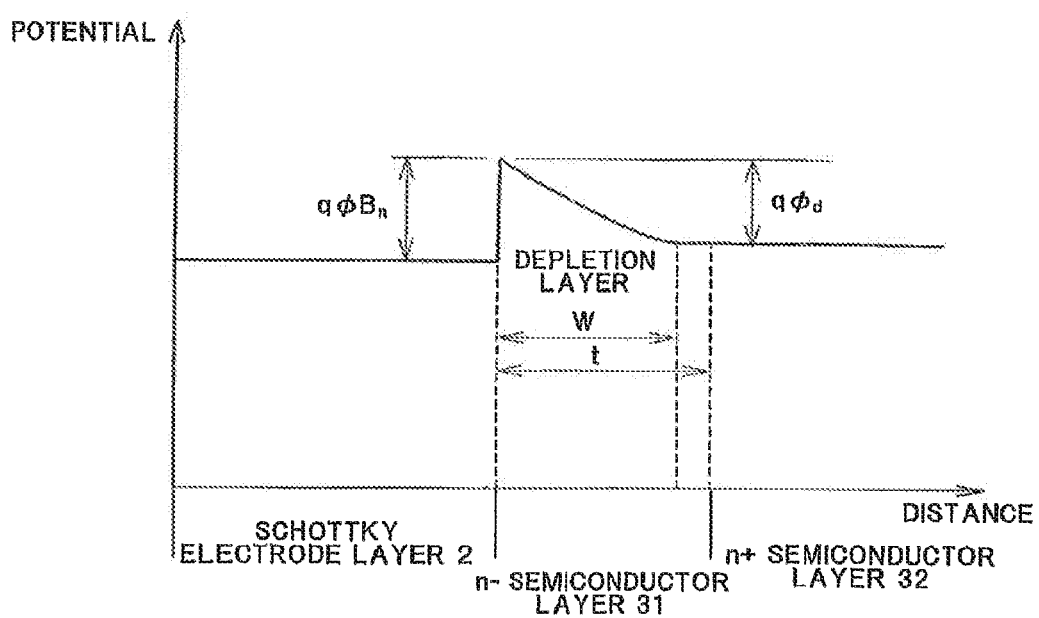
FIG. 3 is a schematic view showing an example of energy band in the Schottky diode of the embodiment according to the invention.

FIG. 3 is a schematic view showing energy band at a Schottky contact portion. Here, q is electric charge of one electron, $\phi B_n$ is a Schottky barrier and $\phi_d$ is a potential barrier (inner potential).

As shown in FIG. 3, the n⁻ semiconductor layer 31 is formed to have a thickness t which corresponds to a width W of a depletion layer formed when applying a reverse voltage up to a reverse withstand voltage VRM and is greater than the width W of the depletion layer. In this regard, however, it is ideal and most desirable that the width W of the depletion layer coincide with the thickness t of the n⁻ semiconductor layer 31. It is because, when the thickness t of the n⁻ semiconductor layer 31 is greater than the width W of the depletion layer, electric resistance of the n⁻ semiconductor layer 31 increases by the difference.

Here, the width W of the depletion layer in the Schottky diode 1 depends on the electron carrier concentration Nd in the n⁻ semiconductor layer 31, which can be represented by the following formula (1). Here, ε is dielectric constant of $Ga_2O_3$. That is, it is possible to derive the width W of the depletion layer once the reverse withstand voltage VRM mentioned above and the electron carrier concentration Nd are determined. Then, with the width W of the depletion layer as a target, the n⁻ semiconductor layer 31 is formed so that the thickness of the epitaxially-grown $Ga_2O_3$ having a low electron carrier concentration is not less than the width W of the depletion layer (t≥W).

$$W = \sqrt{\frac{2\varepsilon \cdot VRM}{q \cdot Nd}} \quad \text{Formula (1)}$$

The electron carrier concentration in the n⁺ semiconductor layer 32 is set to a necessary concentration (e.g., a higher value than 10^18 cm^−3) according to electric resistance (forward on-resistance) or forward voltage required for the Schottky diode 1. In addition, the electron carrier concentration in the n⁺ semiconductor layer 32 is desirably 10 times or more higher than the electron carrier concentration in the n⁻ semiconductor layer 31. It is because electrical resistance of the entire n-type semiconductor layer 3 becomes smaller with higher electron carrier concentration in the n⁺ semiconductor layer 32.

Operation of Schottky Diode 1

When voltage V in a forward direction (electric potential is positive on the Schottky electrode layer 2 side) is applied to the Schottky diode 1, $\phi_d$ shown in FIG. 3 becomes ($\phi_d$−V), resulting in an increase in electric current generated by electrons moving from the n-type semiconductor layer 3 to the Schottky electrode layer 2. As a result, a forward current flows from the Schottky electrode layer 2 to the ohmic electrode layer 4.

On the other hand, when voltage V in a reverse direction (electric potential is negative on the Schottky electrode layer 2 side) is applied to the Schottky diode 1, $\phi_d$ becomes ($\phi_d$+V), which results in that the electric current generated by electrons moving from the n-type semiconductor layer 3 to the Schottky electrode layer 2 becomes substantially zero. In addition, a depletion layer spreads toward the n⁺ semiconductor layer 32 according to the voltage V. However, the depletion layer never reaches the n⁺ semiconductor layer 32 even when a reverse voltage up to a reverse withstand voltage VRM is applied since the thickness t of the n⁻ semiconductor layer 31 is formed larger than the width W of the depletion layer which is derived based on the above formula (1).

Functions and Effects of the Embodiment

The following functions and effects are obtained in the present embodiment.

In the Schottky diode 1 of the present embodiment, a $Ga_2O_3$-based compound is used as a material of the n-type semiconductor layer 3. Since the $Ga_2O_3$-based compound has electric field-breakdown strength higher than Si and SiC which are used as the conventional materials of Schottky diode, it can increase the reverse withstand voltage as compared to using the conventional materials.

In addition, the n-type semiconductor layer 3 is composed of the n⁻ semiconductor layer 31 having a low electron carrier concentration and the n⁺ semiconductor layer 32 having a high electron carrier concentration. Although the $Ga_2O_3$-based compound can increase the reverse withstand voltage due to high electric field-breakdown strength as previously mentioned, the effect of increasing the reverse withstand voltage is limited when the entire n-type semiconductor layer 3 has a high electron carrier concentration since the reverse withstand voltage is inversely proportional to the electron carrier concentration. However, it is possible to further increase the reverse withstand voltage in the present embodiment since the n⁻ semiconductor layer 31 is formed on the side of the Schottky electrode layer 2.

In addition, since the n⁻ semiconductor layer 31 has a thickness greater than a width W of a depletion layer formed when applying a reverse voltage up to a reverse withstand voltage VRM, the depletion layer never reaches the n⁺ semiconductor layer 32 even if the reverse voltage up to the reverse withstand voltage VRM is applied thereto.

In addition, it is possible to secure a reverse withstand voltage VRM of not less than 1000 V by setting the electron carrier concentration of the n⁻ semiconductor layer 31 within a range lower than $10^{17}$ cm⁻³. Furthermore, it is possible to secure a reverse withstand voltage VRM of not less than 10000 V by setting the electron carrier concentration of the n⁻ semiconductor layer 31 within a range lower than $10^{16}$ cm⁻³. In addition, by setting the electron carrier concentration of the n⁺ semiconductor layer 32 to not less than $10^{18}$ cm⁻³, it is possible to control the electrical resistance of the entire n-type semiconductor layer 3 and, further, it is possible to control an increase in contact resistance with the ohmic electrode layer 4. This allows a decrease in the forward voltage of the Schottky diode 1.

Example 1

Next, more specific Example of the invention will be described.

In the present Example, a 600 μm-thick β-$Ga_2O_3$ substrate made by the FZ (Floating Zone) method was used as the n⁺ semiconductor layer 32. Si was doped as a dopant into the β-$Ga_2O_3$ substrate at an electron carrier concentration of $1 \times 10^{19}$ cm⁻³. In addition, the plane orientation of the substrate was (010). The plane orientation of the substrate is not specifically limited but a plane rotated by not less than 50° and not more than 90° with respect to a (100) plane is preferable, and there are, e.g., a (010) plane, a (001) plane, a (−201) plane, a (101) plane and a (310) plane. It is thereby possible to suppress re-evaporation from the substrate and to increase growth rate. Alternatively, it may be a plane of which plane orientation is rotated by an angle of not more than 37.5° from the (010) plane. In this case, it is possible to provide a steep interface between the n⁺ semiconductor layer 32 and the n⁻ semiconductor layer 31 and it is also possible to accurately control the thickness of the n⁻ semiconductor layer 31.

A 1.4 μm-thick β-$Ga_2O_3$ single crystal was epitaxially grown on the above-mentioned β-$Ga_2O_3$ substrate (the n⁺ semiconductor layer 32) by the MBE method, thereby forming the n⁻ semiconductor layer 31. Sn was used as a dopant at and the electron carrier concentration was $4 \times 10^{16}$/cm⁻³.

The Schottky electrode layer 2 was formed to have a two-layer structure composed of 30 nm-thick Pt in Schottky-contact with the n⁻ semiconductor layer 31 and 170 nm-thick Au formed on the Pt.

The ohmic electrode layer 4 was formed to have a two-layer structure composed of 100 nm-thick Ti in ohmic-contact with the n⁺ semiconductor layer 32 and 100 nm-thick Au formed on the Ti.

Comparative Example

Figure 4:
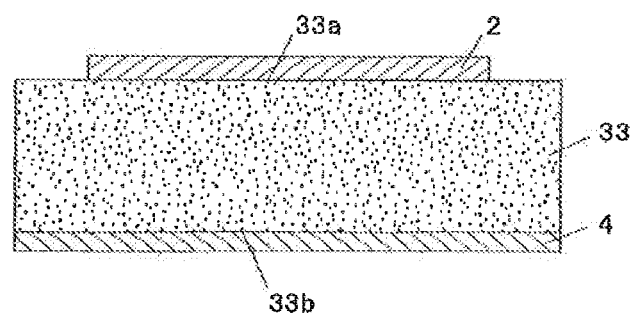
FIG. 4 is a cross sectional view showing a configuration example of a Schottky diode in Comparative Example.

FIG. 4 is a schematic view showing a cross-sectional structure of a Schottky diode 10 as Comparative Example. In the Schottky diode 10, an n⁻ semiconductor layer 33 has a single-layer structure of a 400 μm-thick β-$Ga_2O_3$-based substrate made by the EFG method, the Schottky electrode layer 2 is formed on one main surface 33a of the n⁻ semiconductor layer 33 and the ohmic electrode layer 4 is formed on another main surface 33b. Configurations of the Schottky electrode layer 2 and the ohmic electrode layer 4 are the same as those in the above Example. In addition, the n⁻ semiconductor layer 33 was 400 μm in thickness and had the electron carrier concentration adjusted to $8 \times 10^{16}$ cm⁻³ by not doping and not performing heat treatment in a nitrogen atmosphere.

Figure 5:
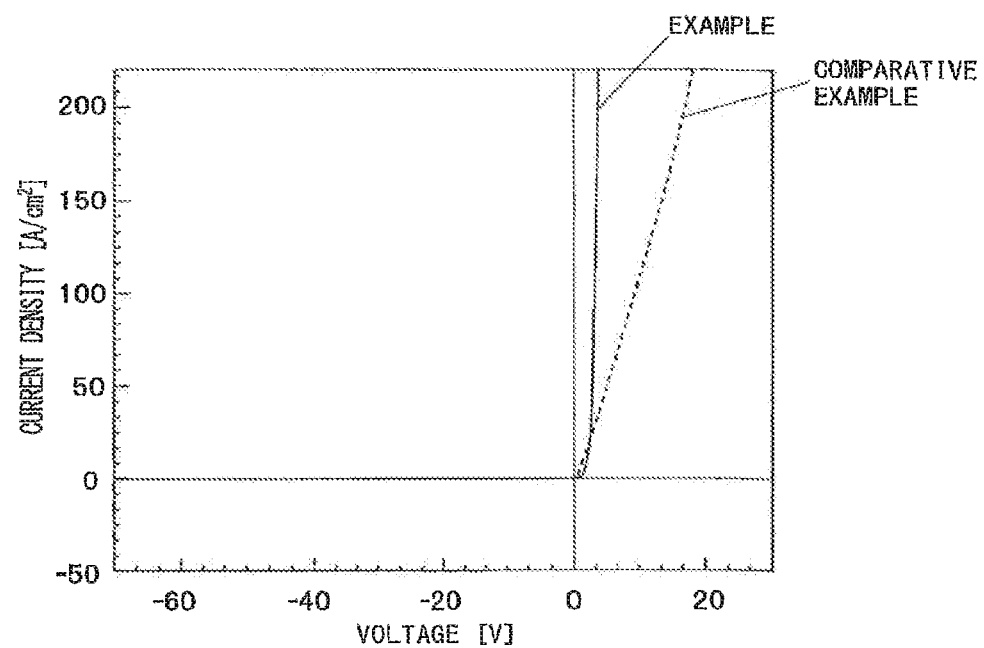
FIG. 5 is a graph showing voltage-current density characteristics of a Schottky diode in Example and a Schottky diode in Comparative Example.

FIG. 5 is a graph showing the voltage-current density characteristics of the Schottky diode 1 in Example according to the invention configured as described above and the Schottky diode 10 in Comparative Example. As shown in the drawing, when voltage in a positive direction is applied, the current density rises steeply in the Schottky diode 1. On the other hand, the rise of the current density in the Schottky diode 10 is slower than the Schottky diode 1.

This shows that a multi-layer structure of the semiconductor layer 3 composed of the n semiconductor layer 31 and the n⁺ semiconductor layer 32 and the resulting reduction in electric resistance of the n⁺ semiconductor layer 32 allow forward voltage in the Schottky diode 1 to be reduced. In addition, contact resistance between the ohmic electrode layer 4 and the semiconductor layer 3 is reduced by increasing the electron carrier concentration in the n⁺ semiconductor layer 32 in contact with the ohmic electrode layer 4 and it is considered that this also contributes to reduce forward voltage.

Modifications of Schottky Diode

Next, three modifications in structure of the Schottky diode in the present embodiment of the invention will be described in reference to FIGS. 6A to 8B. In these modifications, the parameters such as the carrier concentration and thickness of the n⁻ semiconductor layer 31 and the n⁺ semiconductor layer 32 can be set to the same as those described above.

Modification 1

Figure 6A:
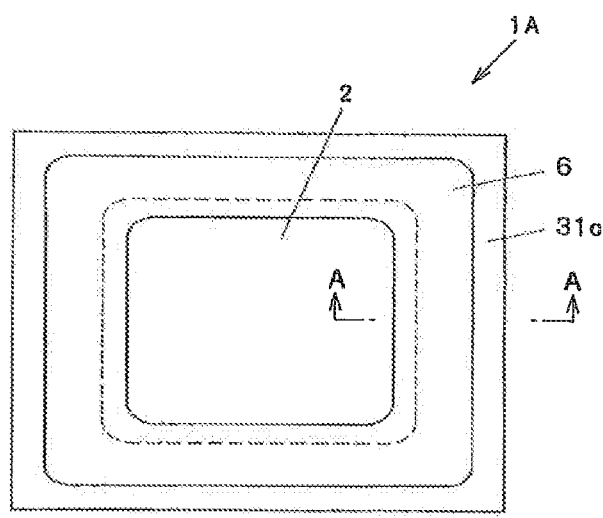
FIG. 6A is a plan view showing a Schottky diode in a first modification of the embodiment according to the invention.
Figure 6B:
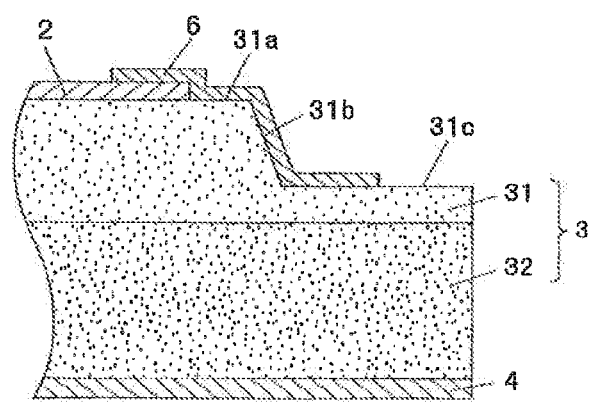
FIG. 6B is a cross sectional view taken along a line A-A in FIG. 6A.

FIGS. 6A and 6B show a barrier diode 1A in the first modification of the embodiment according to the invention, wherein FIG. 6A is a plan view and FIG. 6B is a cross sectional view taken along the line A-A in FIG. 6A.

The Schottky diode 1A is square in plan view and has the square Schottky electrode layer 2 at the middle portion. In addition, the Schottky diode 1A is provided with the n-type semiconductor layer 3. The n-type semiconductor layer 3 is provided with the n semiconductor layer 31 with a low electron carrier concentration and the $n^+$ semiconductor layer 32 with a high electron carrier concentration. In the n-type semiconductor layer 3, the $n^-$ semiconductor layer 31 with a low electron carrier concentration is formed on a side in Schottky-contact with the Schottky electrode layer 2. The ohmic electrode layer 4 is formed on a surface of the $n^+$ semiconductor layer 32 opposite to the $n^-$ semiconductor layer 31.

The $n^-$ semiconductor layer 31 has a mesa structure having a flat upper surface 31a formed on the opposite side to the $n^+$ semiconductor layer 32 and a side surface 31b inclined so as to extend from an outer edge of the upper surface 31a toward the $n^+$ semiconductor layer 32. A lower surface 31c parallel to the upper surface 31a is formed on the outer side of the side surface 31b so as to surround the side surface 31b. The Schottky electrode layer 2 is formed on the upper surface 31a at a predetermined distance from the side surface 31b.

A PV (passivation) film 6 is formed in a region between the periphery of the Schottky electrode layer 2 to a portion of the lower surface 31c on the side surface 31b side. The PV film 6 is formed to cover the periphery of the Schottky electrode layer 2 and the $n^-$ semiconductor layer 31 on the outer side of the Schottky electrode layer 2, i.e., the upper surface 31a, the side surface 31b and the portion of the lower surface 31c on the side surface 31b side.

In the Schottky diode 1A, electric field concentration at an edge of the Schottky electrode layer 2 is reduced by an electric field relaxation effect of the mesa structure of the n semiconductor layer 31. Therefore, a decrease in reverse withstand voltage due to the electric field concentration at the edge of the Schottky electrode layer 2 is suppressed.

Modification 2

Figure 7A:
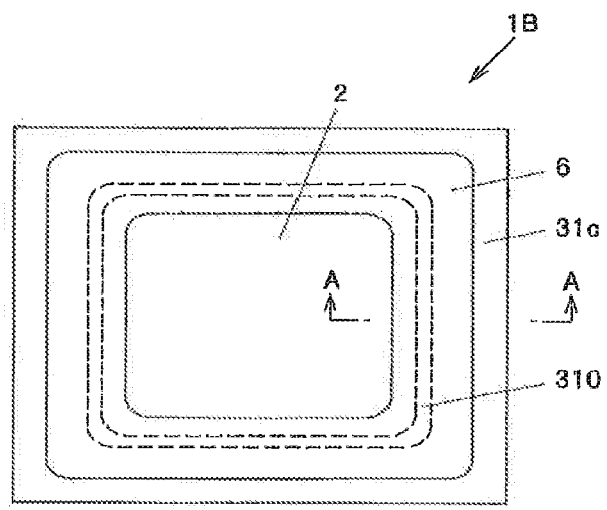
FIG. 7A is a plan view showing a Schottky diode in a second modification of the embodiment according to the invention.
Figure 7B:
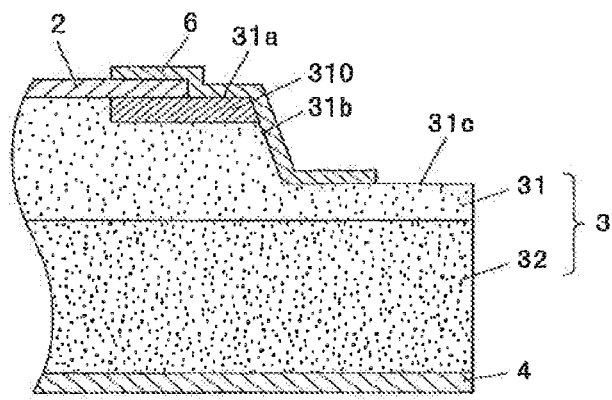
FIG. 7B is a cross sectional view taken along a line A-A in FIG. 7A.

FIGS. 7A and 7B show a Schottky diode 1B in the second modification of the embodiment according to the invention, wherein FIG. 7A is a plan view and FIG. 7B is a cross sectional view taken along the line A-A in FIG. 7A.

In the Schottky diode 1B, a configuration in which a resistive layer 310 is formed in a portion of the $n^-$ semiconductor layer 31 is different from the Schottky diode 1A and the remaining configuration is the same as the Schottky diode 1A. The resistive layer 310 is formed in the $n^-$ semiconductor layer 31 on the upper surface 31a side from a portion in contact with the periphery of the Schottky electrode layer 2 to the side surface 31b. The resistive layer 310 can be formed by, e.g., annealing treatment in oxygen atmosphere performed after forming the $n^-$ semiconductor layer 31 on the $n^+$ semiconductor layer 32. Alternatively, this region may be a p-type layer in place of the resistive layer 310.

In the Schottky diode 1B, the electric field concentration at the edge of the Schottky electrode layer 2 is further reduced by an electric field relaxation effect of the resistive layer 310 or the p-type layer in addition to the electric field relaxation effect of the mesa structure of the $n^-$ semiconductor layer 31. Therefore, a decrease in reverse withstand voltage due to the electric field concentration at the edge of the Schottky electrode layer 2 is further suppressed.

Modification 3

Figure 8A:
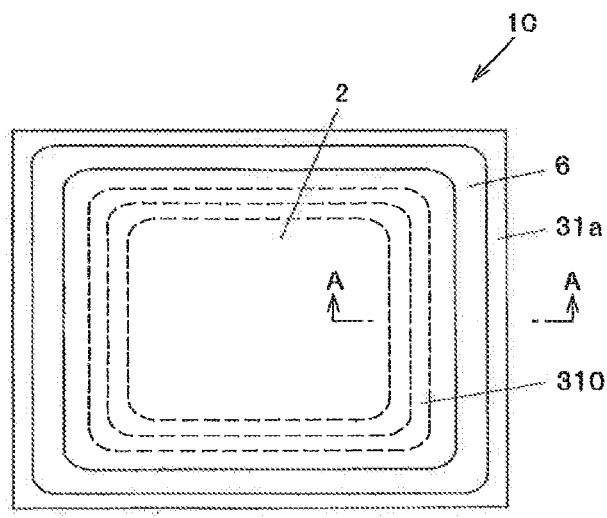
FIG. 8A is a plan view showing a Schottky diode in a third modification of the embodiment according to the invention.
Figure 8B:
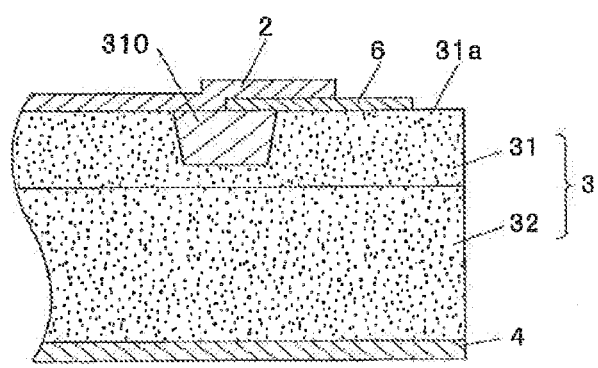
FIG. 8B is a cross sectional view taken along a line A-A in FIG. 8A.

FIGS. 8A and 8B show a Schottky diode 1C in the third modification of the embodiment according to the invention, wherein FIG. 8A is a plan view and FIG. 8B is a cross sectional view taken along the line A-A in FIG. 8A.

The Schottky diode 1C is square in plan view and is provided with the n-type semiconductor layer 3 composed of the $n^-$ semiconductor layer 31 and the $n^+$ semiconductor layer 32. The PV film 6 is formed on the upper surface 31a of the $n^-$ semiconductor layer 31 at the periphery thereof. In addition, the Schottky electrode layer 2 is formed at the middle portion of the upper surface 31a of the $n^-$ semiconductor layer 31. A portion of the Schottky electrode layer 2 in a peripheral region covers the PV film 6.

The resistive layer 310 is formed in the $n^-$ semiconductor layer 31 on the upper surface 31a side in a region including an interface between the Schottky electrode layer 2 and the PV film 6. Alternatively, this region may be a p-type layer having a guard ring structure in place of the resistive layer 310. Furthermore, regarding the resistive layer 310 and the PV film 6, it may be a structure having only the PV film 6 without the resistive layer 310.

The ohmic electrode layer 4 is formed on a surface of the $n^+$ semiconductor layer 32 opposite to the $n^-$ semiconductor layer 31.

In the Schottky diode 1C, since the electric field concentration at the edge of the Schottky electrode layer 2 is reduced by a field plate effect of the Schottky electrode layer 2 formed on the PV film 6, a decrease in reverse withstand voltage due to the electric field concentration at the edge of the Schottky electrode layer 2 is suppressed. In addition, when the resistive layer 310 or the p-type layer is formed, an electric field relaxation effect thereof further reduces the electric field concentration at the edge of the Schottky electrode layer 2. Therefore, a decrease in reverse withstand voltage due to the electric field concentration at the edge of the Schottky electrode layer 2 is further suppressed.

Although the plural preferred embodiments of the invention have been described, the invention is not intended to be limited to the embodiments, and the various kinds of modifications and applications can be implemented without departing from the gist thereof. For example, in addition to the configuration in the above-mentioned embodiment (vertical type), the Schottky diode 1 may be of a horizontal type in which the Schottky electrode layer 2 and the ohmic electrode layer 4 are deposited on the same side of the n-type semiconductor layer 3.

INDUSTRIAL APPLICABILITY

A Schottky barrier diode is provided that can prevent an increase in the forward voltage and an increase in the contact resistance with the ohmic electrode layer even when the reverse withstand voltage (or reverse breakdown voltage) is increased.

REFERENCE SIGNS LIST 1, 1A, 1B 1C Schottky diode
2 Schottky electrode layer
3 n-type semiconductor layer 3a first main surface
3b second main surface
4 ohmic electrode layer
5 protective electrode layer
6 PV film
31 n⁻ semiconductor layer
31a upper surface
31b side surface
31c lower surface
32 n⁺ semiconductor layer
33 n⁻ semiconductor layer
t thickness of n⁻ semiconductor layer
W width of depletion layer
$\phi B_n$ Schottky barrier
$\phi_d$ a potential barrier
$\phi_m$ work function of metal
$\chi$ electron affinity

What is claimed is:

1. A Schottky barrier diode, comprising:
a first n-type semiconductor layer comprising a $\beta$-$Ga_2O_3$-based single crystal epitaxial layer and having a first carrier concentration that determines reverse breakdown voltage and forward voltage;
a second n-type semiconductor layer comprising a $\beta$-$Ga_2O_3$-based single crystal substrate and having a second carrier concentration that is greater than the first carrier concentration and determines forward voltage;
a Schottky electrode provided on a surface of the first n-type semiconductor layer on the opposite side to the second n-type semiconductor layer; and
an ohmic electrode provided on a surface of the second n-type semiconductor layer on the opposite side to the first n-type semiconductor layer,
wherein the $\beta$-$Ga_2O_3$-based single crystal substrate comprises a surface that has a plane orientation rotated by an angle of not more than 37.5° from a (010) plane to provide a steep interface between the second n-type semiconductor layer and the first n-type semiconductor layer.

2. The Schottky barrier diode according to claim 1, wherein the first n-type semiconductor layer has a thickness greater than a thickness of a depletion layer that is determined by the first carrier concentration.

3. The Schottky barrier diode according to claim 1, wherein the first carrier concentration in the first n-type semiconductor layer is not more than $1 \times 10^{18}/cm^3$.

4. The Schottky barrier diode according to claim 1, wherein the first carrier concentration in the first n-type semiconductor layer is not more than $1 \times 10^{17}/cm^3$.

5. The Schottky barrier diode according to claim 1, wherein the first carrier concentration in the first n-type semiconductor layer is not more than $1 \times 10^{16}/cm^3$.

6. The Schottky barrier diode according to claim 1, wherein the second carrier concentration in the second n-type semiconductor layer is not less than $1 \times 10^{18}/cm^3$.

7. The Schottky barrier diode according to claim 1, wherein the first n-type semiconductor layer has a thickness greater than a thickness of a depletion layer.

8. A Schottky barrier diode, comprising:
a first semiconductor layer of a first-type comprising a $\beta$-$Ga_2O_3$-based single crystal epitaxial layer and having a first carrier concentration;
a second semiconductor layer of the first-type comprising a $\beta$-$Ga_2O_3$-based single crystal substrate and having a second carrier concentration that is greater than the first carrier concentration;
a Schottky electrode provided on a surface of the first semiconductor layer of the first-type on the opposite side to the second semiconductor layer of the first-type; and
an ohmic electrode provided on a surface of the second semiconductor layer of the first-type on the opposite side to the first semiconductor layer of the first-type,
wherein the $\beta$-$Ga_2O_3$-based single crystal substrate comprises a surface that has a plane orientation rotated by an angle of not more than a predetermined value from a plane to provide a steep interface between the second semiconductor layer and the first semiconductor layer,
wherein the predetermined value of the angle is not more than 37.5° from the plane including a (010) plane, and
wherein the first-type is an n-type semiconductor.

9. The Schottky barrier diode according to claim 8, wherein the first semiconductor layer of the first-type includes a thickness greater than a thickness of a depletion layer that is determined by the first carrier concentration.

10. The Schottky barrier diode according to claim 8, wherein the first carrier concentration in the first semiconductor layer is not more than $1 \times 10^{18}/cm^3$.

11. The Schottky barrier diode according to claim 8, wherein the first carrier concentration in the first semiconductor layer is not more than $1 \times 10^{17}/cm^3$.

12. The Schottky barrier diode according to claim 8, wherein the first carrier concentration in the first semiconductor layer is not more than $1 \times 10^{16}/cm^3$.

13. The Schottky barrier diode according to claim 8, wherein the second carrier concentration in the second semiconductor layer is not less than $1 \times 10^{18}/cm^3$.

* * * * *